United States Patent
Han et al.

(10) Patent No.: US 11,558,034 B2
(45) Date of Patent: Jan. 17, 2023

(54) ACOUSTIC RESONATOR FILTER

(71) Applicant: Samsung Electro-Mechanics Co., Ltd., Suwon-si (KR)

(72) Inventors: Sung Han, Suwon-si (KR); Yoon Sok Park, Suwon-si (KR); Tae Kyung Lee, Suwon-si (KR); Hwa Sun Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/106,415

(22) Filed: Nov. 30, 2020

(65) Prior Publication Data
US 2022/0069800 A1 Mar. 3, 2022

(30) Foreign Application Priority Data
Aug. 28, 2020 (KR) .................. 10-2020-0109094

(51) Int. Cl.
*H03H 9/60* (2006.01)
*H03H 9/02* (2006.01)
*H03H 9/17* (2006.01)

(52) U.S. Cl.
CPC ............ *H03H 9/605* (2013.01); *H03H 9/02* (2013.01); *H03H 9/02015* (2013.01); *H03H 9/172* (2013.01); *H03H 9/60* (2013.01)

(58) Field of Classification Search
CPC ...... H03H 9/172; H03H 9/02015; H03H 9/60; H03H 9/0542; H03H 9/02102; H03H 9/173; H03H 9/174; H03H 9/175; H03H 9/605; H03H 9/02; H03H 9/25; H03H 9/171; H03H 9/72; H03H 9/64

USPC .................................. 333/133, 187, 188
See application file for complete search history.

(56) References Cited

U.S. PATENT DOCUMENTS

| | | | |
|---|---|---|---|
| 5,714,917 A * | 2/1998 | Ella | H03C 1/46 332/149 |
| 7,548,140 B2 | 6/2009 | Jamneala et al. | |
| 2008/0079516 A1 | 4/2008 | Ruby et al. | |
| 2008/0169728 A1 | 7/2008 | Asai et al. | |
| 2016/0191015 A1* | 6/2016 | Ivira | H03H 9/584 333/190 |

(Continued)

FOREIGN PATENT DOCUMENTS

| | | |
|---|---|---|
| JP | 2008-172713 A | 7/2008 |
| KR | 10-0880791 B1 | 2/2009 |
| KR | 10-2018-0008330 A | 1/2018 |

OTHER PUBLICATIONS

John D. Larson III et al, "Power Handling and Temperature Coefficient Studies in FBAR Duplexers for the 1900 MHz PCS Band" 2000, IEEE Ultrasonics Symposium (6 pages in English).

(Continued)

*Primary Examiner* — Rakesh B Patel
*Assistant Examiner* — Jorge L Salazar, Jr.
(74) *Attorney, Agent, or Firm* — NSIP Law

(57) ABSTRACT

An acoustic resonator filter is provided. The acoustic resonator filter includes a rear filter electrically connected between a front port and a rear port, through which a radio frequency (RF) signal passes, the rear filter including at least one film bulk acoustic resonator (FBAR); and a front filter electrically connected between the front port and the rear filter and including at least one solidly mounted resonator (SMR).

18 Claims, 11 Drawing Sheets

(56) References Cited

U.S. PATENT DOCUMENTS

2018/0019832 A1   1/2018  Okuda
2019/0013458 A1*  1/2019  Hill .................... H03H 9/02031

OTHER PUBLICATIONS

Korean Office Action dated Mar. 29, 2022, in counterpart of Korean Patent Application No. 10-2020-0109094 (5 pages in English and 4 pages in Korean).

* cited by examiner

ACOUSTIC RESONATOR FILTER

CROSS-REFERENCE TO RELATED APPLICATION(S)

This application claims the benefit under 35 USC § 119(a) of Korean Patent Application No. 10-2020-0109094 filed on Aug. 28, 2020 in the Korean Intellectual Property Office, the entire disclosure of which is incorporated herein by reference for all purposes.

BACKGROUND

1. Field

The following description relates to an acoustic resonator filter.

2. Description of Related Art

With the recent rapid development of mobile communications devices, chemical and biological testing-related devices, and similar devices, demand for small and lightweight filters, oscillators, resonant elements, acoustic resonant mass sensors, and the like, used in such devices, is increasing.

Acoustic resonators such as bulk acoustic wave (BAW) filters may be configured as devices that implement the small and lightweight filters, the oscillators, the resonant elements, the acoustic resonance mass sensors, and similar devices, and may have a relatively small size and relatively good performance, as compared to dielectric filters, metal cavity filters, wave guides, or the like. Therefore, the acoustic resonators may be widely used in communications modules of modern mobile devices that require relatively good performance (e.g., a relatively wide pass bandwidth).

The above information is presented as background information only to assist in an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an acoustic resonator filter includes a rear filter, electrically connected between a front port and a rear port, through which a radio frequency (RF) signal passes, the rear filter including at least one film bulk acoustic resonator (FBAR); and a front filter, electrically connected between the front port and the rear filter, and including at least one solidly mounted resonator (SMR).

The acoustic resonator filter may further include an insulating layer, disposed below the rear filter and the front filter; and a substrate, disposed below the insulating layer, wherein each of the at least one SMR includes an SMR resonance unit; and an SMR support unit disposed between the SMR resonance unit and the insulating layer, and in which at least one SMR metal layer and at least one SMR insulating layer are alternately stacked.

Each of the at least one FBAR may include an FBAR resonance unit; and a cavity located between the FBAR resonance unit and the insulating layer.

The acoustic resonator filter may further include a sacrificial layer surrounding the cavity, wherein the SMR support unit is disposed between the SMR resonance unit and the sacrificial layer.

The acoustic resonator filter may further include a sacrificial layer that respectively surrounds at least a portion of the SMR support unit and the cavity.

The SMR support unit may be disposed to not overlap the FBAR in a vertical direction.

Each of the at least one FBAR may include an FBAR resonance unit, and wherein a size of the SMR resonance unit in a horizontal direction is smaller than a size of the FBAR resonance unit in the horizontal direction.

The at least one SMR may include at least one series SMR, electrically connected in series between the front port and the rear port; and at least one shunt SMR, shunt-connected in the series SMR, and wherein the at least one FBAR may include at least one series FBAR, electrically connected in series between the front port and the rear port; and at least one shunt FBAR shunt-connected in the series FBAR.

A number of the at least one SMR may be less than a number of the at least one FBAR.

The at least one series SMR may have a structure in which a plurality of series SMRs are connected in parallel with each other.

The front filter further may include at least one second FBAR.

The front filter may include at least one hybrid unit respectively having a structure in which the at least one second FBAR and the at least one SMR are connected in parallel with each other.

The at least one hybrid unit may include at least one series hybrid unit electrically connected in series between the front port and the rear port; and at least one shunt hybrid unit shunt-connected in the series hybrid unit.

The at least one series hybrid unit may include a plurality of series hybrid units connected in series with each other, wherein a size of the SMR resonance unit of the series hybrid unit connected adjacent to the rear port in a horizontal direction, among the plurality of series hybrid units, may be smaller than a size of the SMR resonance unit of the series hybrid unit connected adjacent to the front port in the horizontal direction, among the plurality of series hybrid units.

A size per one of the at least one SMR may be smaller than a size per one of the at least one second FBAR.

The rear filter may have a pass band, and the front filter may have a pass band.

In a general aspect, an acoustic resonator filter includes a front filter, connected between a front port and a rear port, and comprising at least one series solidly mounted resonator (SMR) and at least one shunt film bulk acoustic resonator (FBAR); and a rear filter, connected between the front filter and the rear port, and comprising at least one series FBAR and at least one shunt FBAR, wherein at least one series SMR is electrically connected in series with at least one series FBAR.

The front filter may further include a plurality of series SMR connected in parallel.

Other features and aspects will be apparent from the following detailed description, the drawings, and the claims.

Figure 1A:
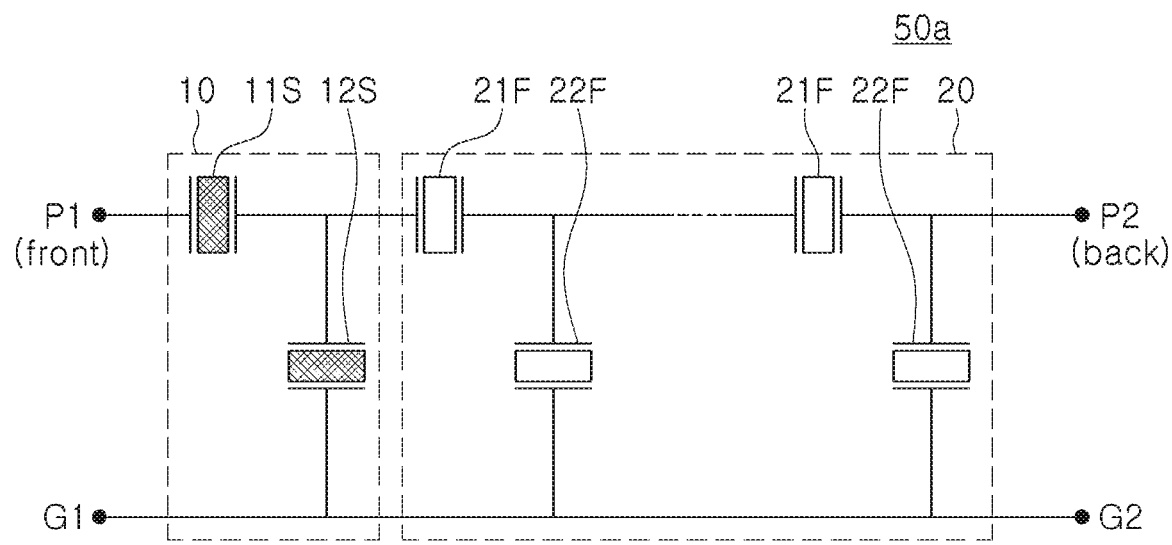
FIGS. 1A to 1H are views illustrating an example acoustic resonator filter, in accordance with respective one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may be also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of this disclosure. Further, although the examples described herein have a variety of configurations, other configurations are possible as will be apparent after an understanding of this disclosure.

Herein, it is noted that use of the term "may" with respect to an example, for example, as to what an example may include or implement, means that at least one example exists in which such a feature is included or implemented while all examples are not limited thereto.

FIGS. 1A to 1H are views illustrating an acoustic resonator filter, in accordance with one or more embodiment.

Referring to FIG. 1A, an acoustic resonator filter 50a, in accordance with one or more embodiment, may include a front filter 10 and a rear filter 20.

The rear filter 20 may be electrically connected between a rear port P2 and a front port P1, or between the rear port P2 and the front filter 10, through which a radio frequency (RF) signal passes, and may filter a frequency component, outside of a pass band of the rear filter 20, among frequency components of the RF signal.

The front filter 10 may be electrically connected between the front port P1 and the rear filter 20, and may thus be electrically connected closer to the front port P1, as compared to the rear filter 20. The front filter 10 may filter a frequency component, outside of a pass band of the front filter 10, among frequency components of the RF signal. For example, the pass band of the front filter 10 and the pass band of the rear filter 20 may be adjacent to each other or may be the same.

The RF signal may be input to the acoustic resonator filter 50a through the front port P1, may be filtered by the front filter 10 and the rear filter 20, and may be output from the acoustic resonator filter 50a through the rear port P2.

When the RF signal is a transmit signal, the front port P1 may be electrically connected closer to an RF circuit (e.g., an amplifier, a mixer, or the like), as compared to the rear port P2, and the rear port P2 may be electrically connected closer to an antenna, as compared to the front port P1.

When the RF signal is a receive signal, the front port P1 may be electrically connected closer to an antenna, as compared to the rear port P2, and the rear port P2 may be electrically connected closer to an RF circuit, as compared to the front port P1.

The front filter 10 and the rear filter 20 may respectively include at least one acoustic resonator. The acoustic resonator may convert electrical energy of the RF signal into mechanical energy, and vice versa, due to piezoelectric characteristics. As a frequency of the RF signal becomes close to a resonance frequency of the acoustic resonator, an energy transfer rate between a plurality of electrodes may greatly increase. As a frequency of the RF signal becomes close to an anti-resonance frequency of the acoustic resonator, an energy transfer rate between a plurality of electrodes may greatly decrease. Therefore, attenuation characteristics (or skirt characteristics) of the acoustic resonator near a (anti-) resonance frequency may be higher than attenuation characteristics of a passive element (e.g., a capacitor, an inductor, or similar elements).

In an example, the rear filter 20 may include at least one film bulk acoustic resonator (FBAR). As compared to a solidly mounted resonator (SMR), an FBAR may be easily mass-produced at relatively low cost, may be advantageous in that it may be size-reduced, may be advantageous in that it may have a high quality factor (QF) value, a main characteristic of a filter, and may have a relatively wide range of a pass band.

In an example, the front filter 10 may include at least one SMR. As compared to FBAR, SMR may have excellent heat dissipation characteristics.

Power of the RF signal may be slightly reduced based on filtration and insertion loss of each of the front filter 10 and the rear filter 20.

Since the RF signal may be input to the acoustic resonator filter 50a through the front port P1, power of the RF signal from the front filter 10 may be greater than power of the RF signal from the rear filter 20.

Amounts of heat generated by the front filter 10 and the rear filter 20 may be greater, as the power of an RF signal to be filtered increases. Therefore, an amount of heat generated by filtration of the front filter 10 may be greater than an amount of heat generated by filtration of the rear filter 20.

Since the amount of heat generated by filtration of the front filter 10 may be greater than the amount of heat generated by filtration of the rear filter 20, excellent heat dissipation characteristics of the SMR may be more efficiently achieved in the front filter 10. Excellent filtration characteristics and high implementation efficiency of the FBAR may be achieved more efficiently in the rear filter 20, which requires relatively small heat dissipation characteristics.

Therefore, the acoustic resonator filter 50a, according to an example, may obtain excellent filtration characteristics and high implementation efficiency while also obtaining excellent heat dissipation characteristics.

Referring to FIG. 1A, the front filter 10 may include a series SMR 11S and a shunt SMR 12S, and the rear filter 20 may include at least one series FBAR 21F and at least one shunt FBAR 22F.

Therefore, the front filter 10 may have excellent heat dissipation characteristics, and the rear filter 20 may have excellent filtration characteristics and high implementation efficiency.

The series SMR 11S and the series FBAR 21F may be electrically connected in series between the rear port P2 and the front port P1s, respectively, may increase a pass rate of the RF signal between the front port P1 and the rear port P2, as a frequency of the RF signal becomes close to a resonance frequency, and may decrease a pass rate of the RF signal between the front port P1 and the rear port P2, as a frequency of the RF signal becomes close to an anti-resonance frequency.

The shunt SMR 12S may be shunt-connected in the series SMR 11S, and the shunt FBAR 22F may be shunt-connected in the series FBAR 21F. In an example, the shunt SMR 12S and the shunt FBAR 22F may be connected between a node between the front port P1 and the rear port P2 and ground ports G1 and G2, respectively, may increase a pass rate of the RF signal facing a ground, as a frequency of the RF signal becomes close to a resonance frequency, and may decrease a pass rate of the RF signal facing a ground, as a frequency of the RF signal becomes close to an anti-resonance frequency.

A pass rate of the RF signal between the front port P1 and the rear port P2 may decrease, as a pass rate of the RF signal facing a ground increases, and may increase, as a pass rate of the RF signal facing a ground decreases. In an example, a pass rate of the RF signal between the front port P1 and the rear port P2 may decrease, as a frequency of the RF signal becomes close to resonance frequencies of the shunt SMR 12S and the shunt FBAR 22F, or anti-resonance frequencies of the series SMR 11S and the series FBAR 21F.

In this example, the anti-resonance frequency may be higher than the resonance frequency. In an acoustic resonator, a difference between the resonance frequency and the anti-resonance frequency may be determined, based on $kt^2$ (electromechanical coupling factor), a physical characteristic of the acoustic resonator. When a size or a shape of the acoustic resonator is changed, the resonance frequency and the anti-resonance frequency may be changed.

Since the anti-resonance frequency may be higher than the resonance frequency, the acoustic resonator filter 50a may have a pass bandwidth that is formed by the lowest frequency corresponding to resonance frequencies of the shunt SMR 12S and the shunt FBAR 22F, and the highest frequency corresponding to anti-resonance frequencies of the series SMR 11S and the series FBAR 21F.

The pass bandwidth may widen, as a difference between the resonance frequencies of the shunt SMR 12S and the shunt FBAR 22F and the anti-resonance frequencies of the series SMR 11S and the series FBAR 21F increases. When the difference is too large, the pass bandwidth may be split.

When resonance frequencies of the series SMR 11S and the series FBAR 21F are slightly higher than anti-resonance frequencies of the shunt SMR 12S and the shunt FBAR 22F, a bandwidth of the acoustic resonator filter 50a may be relatively wide, but may not be split.

As the number of series FBAR 21F and shunt FBAR 22F of the rear filter 20 increases, a pass bandwidth of the rear filter 20 may be more efficiently widened. In an example, the number of series SMR 11S and shunt SMR 12S may be less than the number of series FBAR 21F and shunt FBAR 22F. Therefore, filtration characteristics, implementation efficiency, and heat dissipation characteristics of the acoustic resonator filter 50a according to an embodiment of the present disclosure may be more harmoniously improved.

Figure 1B:
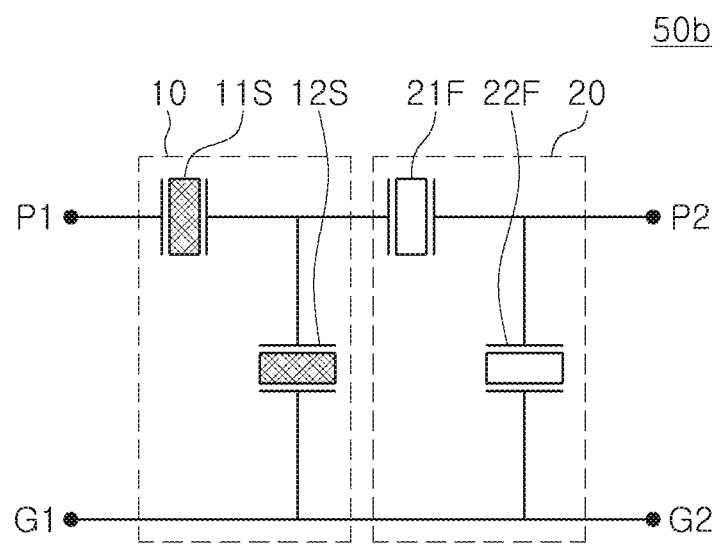

Referring to FIG. 1B, the number of series FBAR 21F and shunt FBAR 22F of an acoustic resonator filter 50b according to an example may be less than that of the acoustic resonator filter 50a illustrated in FIG. 1A. In an example, the number of resonators included in a front filter 10 and a rear filter 20 may be freely set.

Figure 1C:
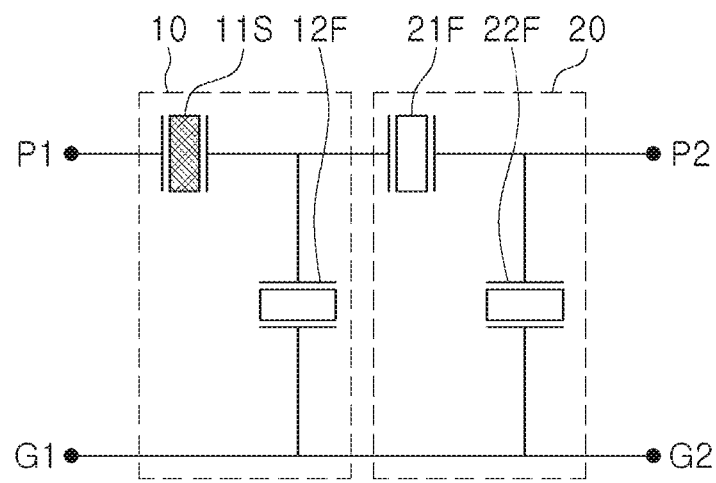

Referring to FIG. 1C, a front filter 10 of an acoustic resonator filter 50c according to an example may include a second shunt FBAR 12F. In an example, the front filter 10 may have a structure in which SMR and FBAR are combined. Therefore, filtration characteristics, implementation efficiency, and heat dissipation characteristics of the front filter 10 may be harmoniously improved.

Figure 1D:
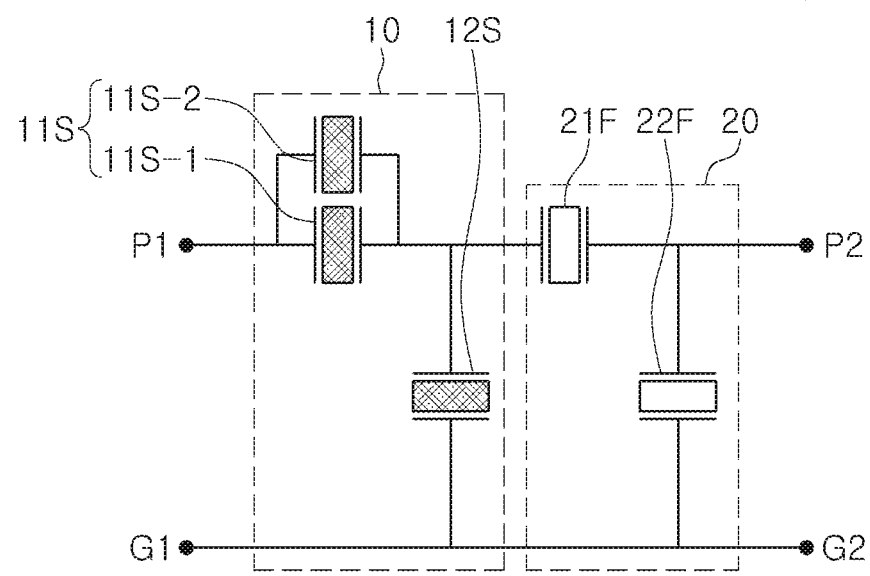

Referring to FIG. 1D, a series SMR 11S of a front filter 10 of an acoustic resonator filter 50d according to an example may have a structure in which a plurality of series SMR 11S-1 and 11S-2 are connected to each other in parallel.

Therefore, since power of an RF signal passing through a front filter 10 may be distributed in the plurality of series SMR 11S-1 and 11S-2 in parallel, heat dissipation performance of the acoustic resonator filter 50d according to an example may be further improved.

Figure 1E:
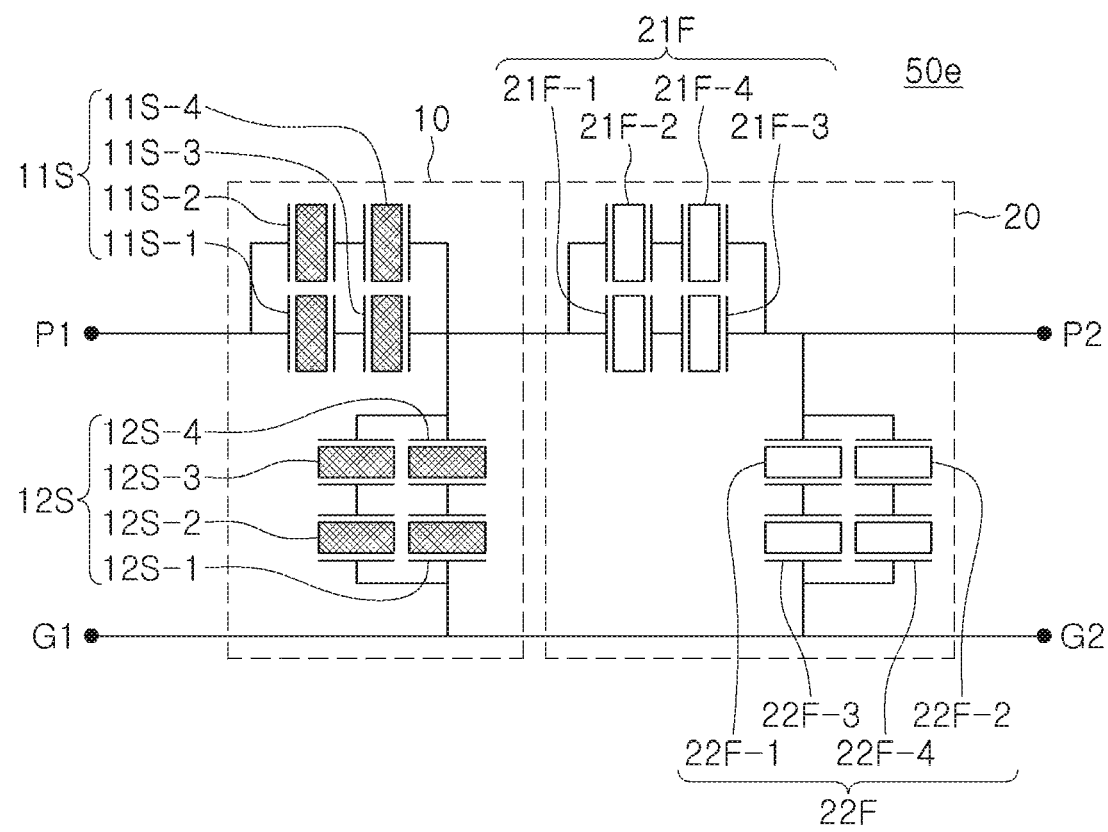

Referring to FIG. 1E, in an acoustic resonator filter 50e according to an example, a series SMR 11S may have a structure in which a plurality of series SMR 11S-1, 11S-2, 11S-3, and 11S-4 are connected in series and/or in parallel, a shunt SMR 12S may have a structure in which a plurality of shunt SMR 12S-1, 12S-2, 12S-3, and 12S-4 are connected in series and/or in parallel, a series FBAR 21F may have a structure in which a plurality of series FBARs 21F-1, 21F-2, 21F-3, and 21F-4 are connected in series and/or in parallel, and a shunt FBAR 22F may have a structure in which a plurality of shunt FBAR 22F-1, 22F-2, 22F-3, and 22F-4 are connected in series and/or in parallel.

Figure 1F:
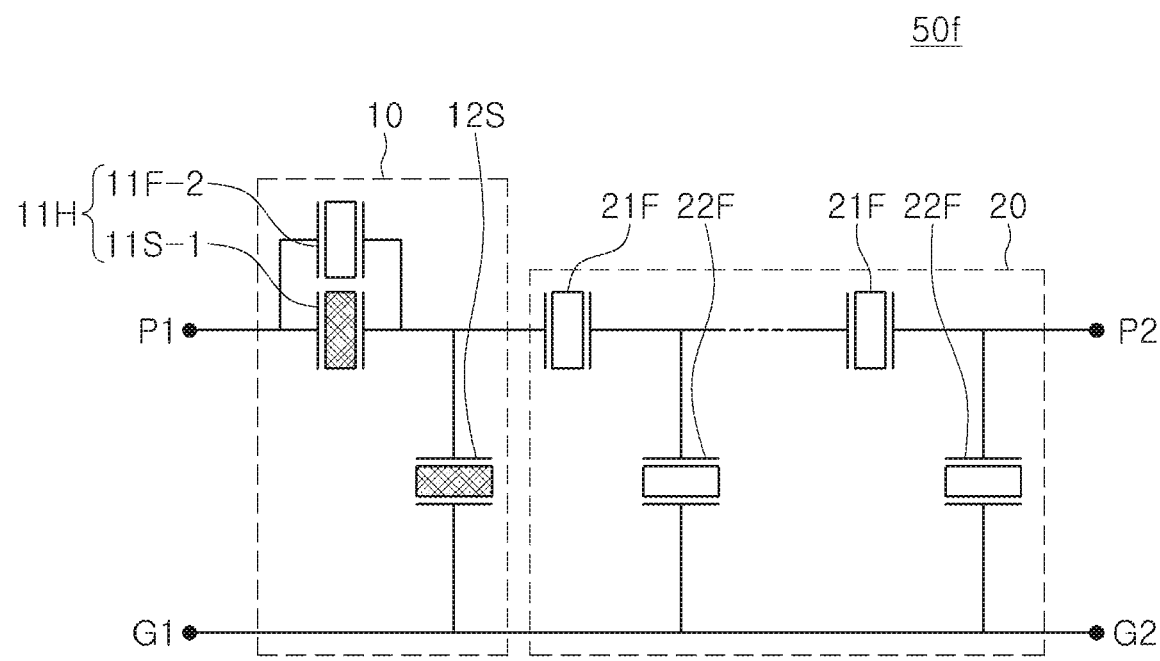

Referring to FIG. 1F, a front filter 10 of an acoustic resonator filter 50f according to an example may include a series hybrid unit 11H.

The series hybrid unit 11H may have a structure in which a series SMR 11S-1 and a second series FBAR 11F-2 are connected to each other in parallel. Therefore, the front filter 10 may have improved heat dissipation characteristics without significantly affecting filtration characteristics of a structure composed of only FBAR, and the acoustic resonator filter 50f may be implemented more stably.

Figure 1G:
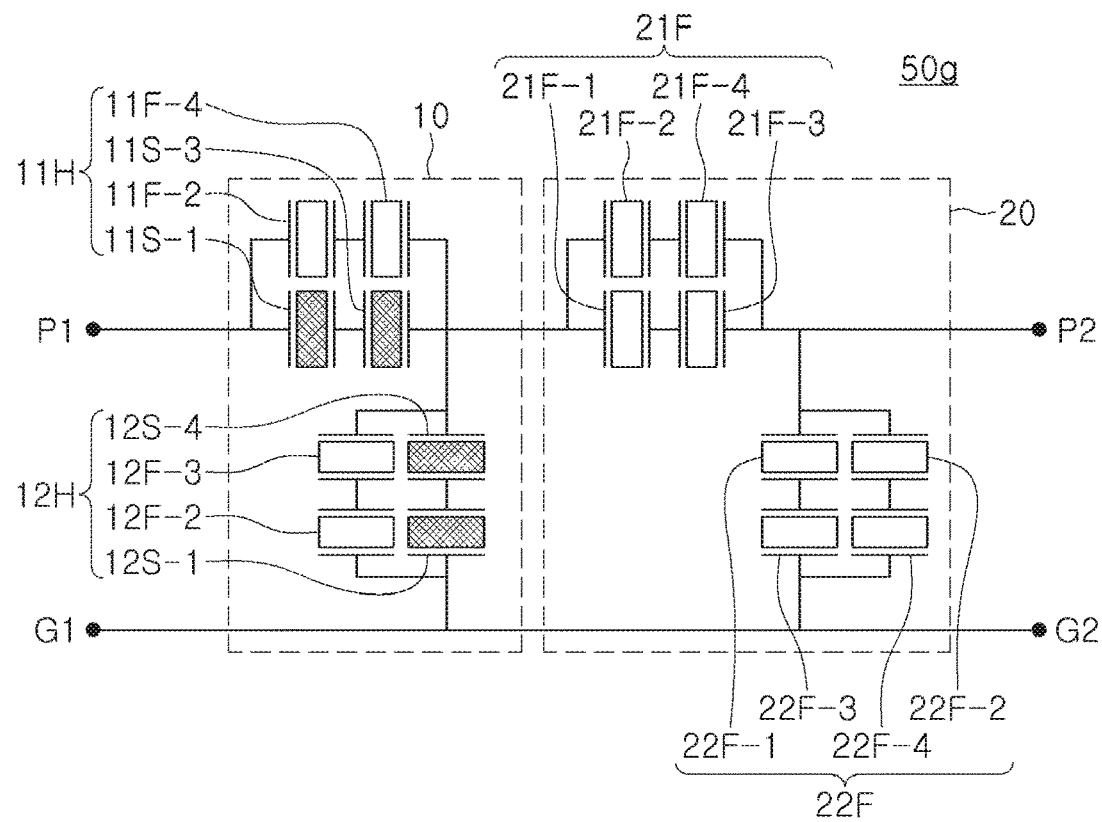

Referring to FIG. 1G, a front filter 10 of an acoustic resonator filter 50g according to an example may include a series hybrid unit 11H and a shunt hybrid unit 12H. In this example, the series hybrid unit 11H may be replaced with a series SMR.

The series hybrid unit 11H may have a structure in which first series SMR 11S-1 and 11S-3 and second series FBAR 11F-2 and 11F-4 are connected to each other in parallel, and may be electrically connected in series between a front port P1 and a rear port P2.

The shunt hybrid unit 12H may have a structure in which shunt SMR 12S-1 and 12S-4 and second shunt FBAR 12F-2 and 12F-3 are connected to each other in parallel, and may be shunt-connected in the series hybrid unit 11H.

Therefore, since an area of dissipating heat generated by the front filter 10 may increase, heat dissipation performance of the front filter 10 may be further improved.

Figure 1H:
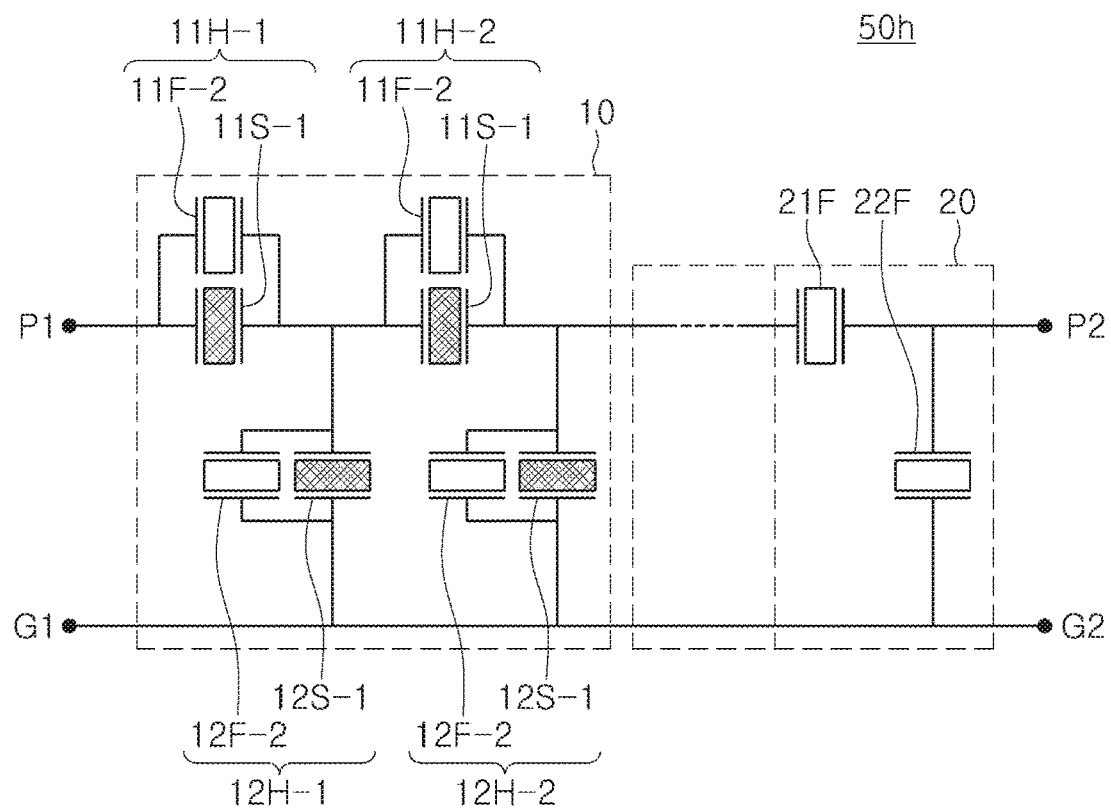

Referring to FIG. 1H, a front filter 10 of an acoustic resonator filter 50h according to an example may include a plurality of series hybrid units 11H-1 and 11H-2, and a plurality of shunt hybrid units 12H-1 and 12H-2. In an example, one of the plurality of shunt hybrid units 12H-1 and 12H-2 may be connected between the plurality of series hybrid units 11H-1 and 11H-2.

Therefore, since an area of dissipating heat generated by the front filter 10 may increase, heat dissipation performance of the front filter 10 may be further improved.

Power of an RF signal passing through the series hybrid unit 11H-1 connected closer to a front port P1 may be greater than power of an RF signal passing through the series hybrid unit 11H-2 connected closer to a rear port P2. Therefore, an amount of heat generated by the series hybrid unit 11H-1 connected closer to the front port P1 may be greater than an amount of heat generated by the series hybrid unit 11H-2 connected closer to the rear port P2.

In an example, a size of the series hybrid unit 11H-2 that is connected closer to the rear port P2 may be smaller than a size of the series hybrid unit 11H-1 that is connected closer to the front port P1.

Therefore, the series hybrid unit 11H-1 that is connected closer to the front port P1 may have relatively high heat dissipation performance for a relatively large amount of heat, and may thus improve heat dissipation performance of the front filter 10 more efficiently.

Figure 2A:
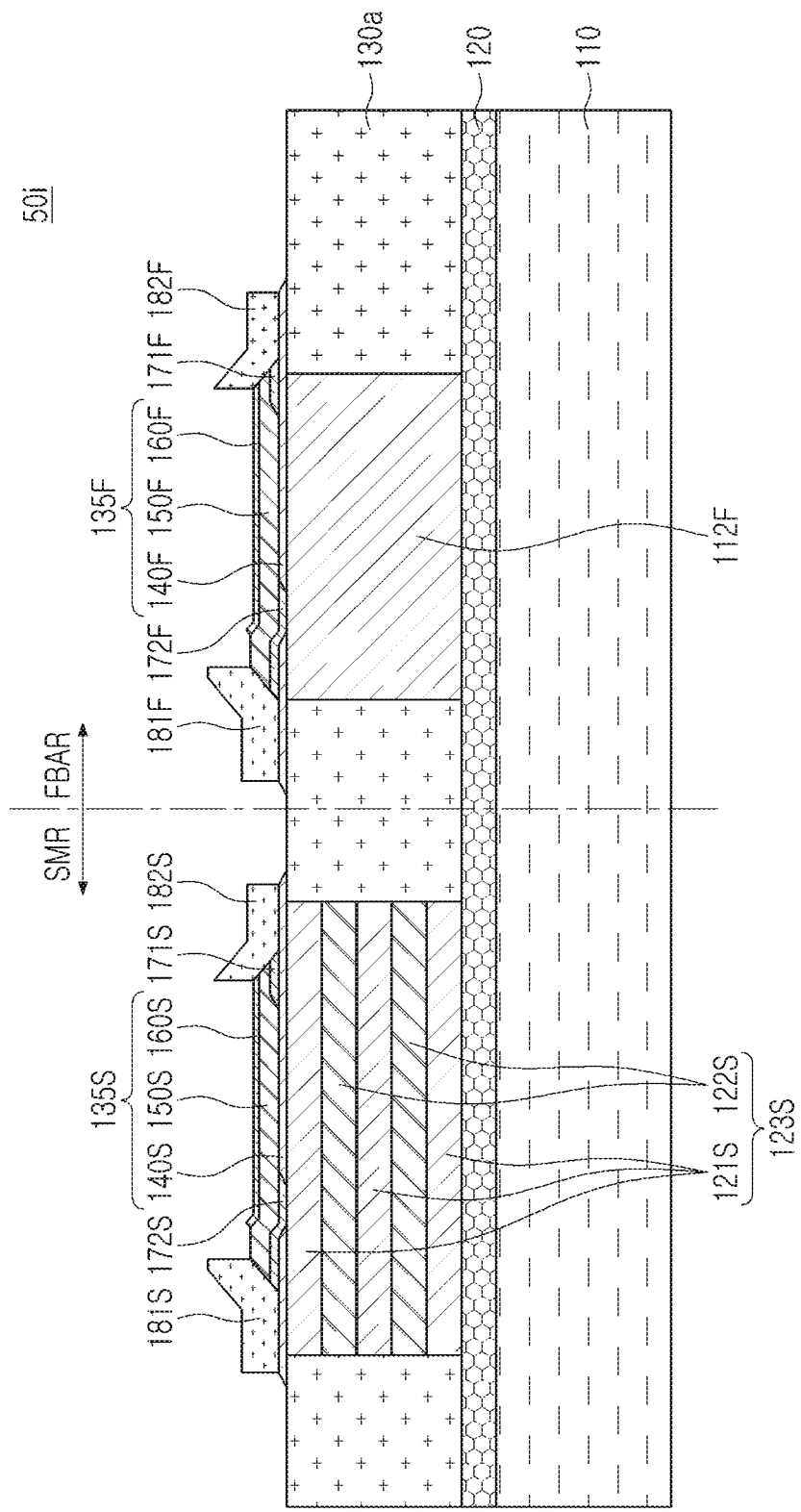
FIGS. 2A and 2B are views illustrating an example solidly mounted resonator (SMR) and an example film bulk acoustic resonator (FBAR) of an acoustic resonator filter, in accordance with respective one or more embodiments.
Figure 2B:
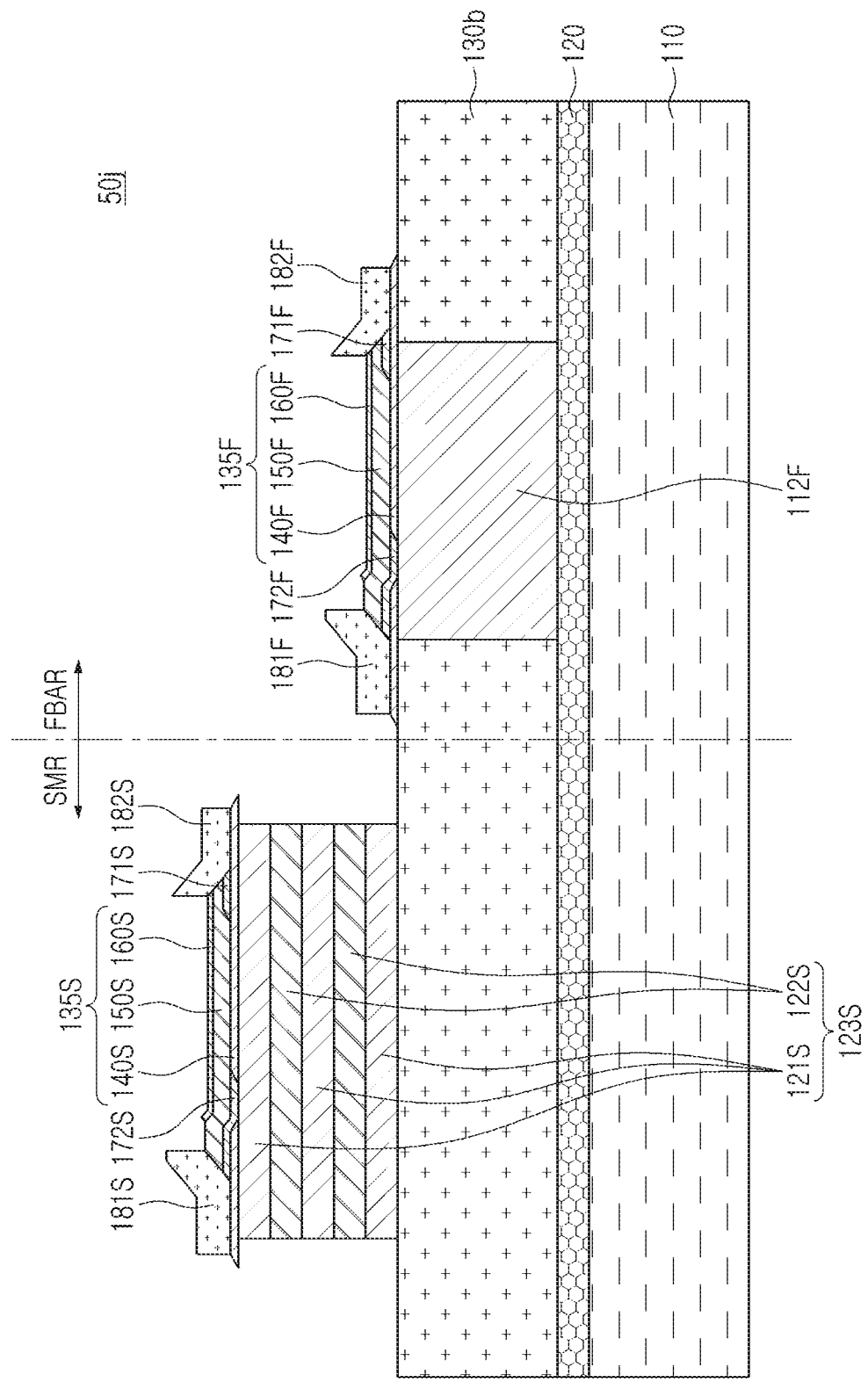

FIGS. 2A and 2B are views illustrating a solidly mounted resonator (SMR) and a film bulk acoustic resonator (FBAR) of an acoustic resonator filter, in accordance with one or more embodiments.

Referring to FIG. 2A, an acoustic resonator filter 50i, according to an example, may include an FBAR including an FBAR resonance unit 135F, and an SMR including an SMR resonance unit 135S. At least one of a substrate 110, a cavity 112F, an insulating layer 120, an SMR support unit 123S, and a sacrificial layer 130a may be further included.

The substrate 110 may be formed as a silicon substrate. The insulating layer 120, which electrically isolates the FBAR resonance unit 135F and the SMR resonance unit 135S from the substrate 110, may be provided on an upper surface of the substrate 110. In an example, the insulating layer 120 may be disposed below a rear filter including the FBAR, and a front filter including the SMR.

The cavity 112F may be disposed on the insulating layer 120. The cavity 112F may be located below the FBAR resonance unit 135F to vibrate the FBAR resonance unit 135F in a predetermined direction. Therefore, the FBAR resonance unit 135F may obtain improved filtration characteristics.

The SMR support unit 123S may be disposed between the SMR resonance unit 135S and the insulating layer 120, and may have a structure in which at least one SMR metal layer 122S and at least one SMR insulating layer 121S are alternately stacked. Therefore, the SMR support unit 123S may obtain improved heat dissipation characteristics.

In an example, the SMR metal layer 122S may be implemented with, as non-limiting examples, gold (Au), a gold-tin (Au—Sn) alloy, copper (Cu), a copper-tin (Cu—Sn) alloy, aluminum (Al), an aluminum alloy, or the like, but is not limited thereto. The SMR insulating layer 121S may be formed of a dielectric material such as, but not limited to, silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$), zinc oxide (ZnO), or the like, but is not limited thereto.

In an example, the SMR support unit 123S may be disposed to not overlap the FBAR in a vertical direction. Therefore, a difference in heights between the SMR support unit 123S and the cavity 112F may be reduced, a difference in heights between the FBAR resonance unit 135F and the SMR resonance unit 135S may be reduced, and the FBAR resonance unit 135F and the SMR resonance unit 135S may be electrically connected to each other more easily.

The sacrificial layer 130a may surround at least a portion of the SMR support unit 123S and the cavity 112F, respectively. In an example, a portion of the sacrificial layer 130a may be removed in a state in which the sacrificial layer 130a is formed, to form the cavity 112F.

Therefore, a difference in heights between the FBAR resonance unit 135F and the SMR resonance unit 135S may be reduced, and the FBAR resonance unit 135F and the SMR resonance unit 135S may be electrically connected to each other more easily.

Referring to FIG. 2A, the SMR resonance unit 135S may include a first SMR electrode 140S, an SMR piezoelectric layer 150S, and a second SMR electrode 160S, and the FBAR resonance unit 135F may include a first FBAR electrode 140F, an FBAR piezoelectric layer 150F, and a second FBAR electrode 160F.

The SMR resonance unit 135S and the FBAR resonance unit 135F may respectively use a piezoelectric phenomenon to output a radio frequency signal having a specific frequency. Specifically, the SMR resonance unit 135S and the FBAR resonance unit 135F may output a radio frequency signal having a resonance frequency, corresponding to vibration, due to the piezoelectric phenomenon of the SMR piezoelectric layer 150S and the FBAR piezoelectric layer 150F.

The first and second SMR electrodes 140S and 160S and the first and second FBAR electrodes 140F and 160F may be formed using, in an example, a conductive material such as molybdenum (Mo) or alloys thereof, respectively, to improve coupling efficiency between the SMR piezoelectric layer 150S and the FBAR piezoelectric layer 150F, but are not limited thereto, and may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

In an example, a seed layer that improves crystal orientation of the piezoelectric layer may be additionally disposed between the electrode and the piezoelectric layer. The seed layer may be formed of one of aluminum nitride (AlN), zinc oxide (ZnO), lead zirconium titanium oxide (PZT; PbZrTiO), having the same crystallinity as the piezoelectric layer.

The SMR piezoelectric layer 150S and the FBAR piezoelectric layer 150F may include a piezoelectric material that generates a piezoelectric effect by converting electrical energy into mechanical energy having a form of an acoustic wave. In an example, the piezoelectric material may include, as non-limiting examples, one of aluminum nitride (AlN), zinc oxide (ZnO), lead zirconium titanium oxide (PZT; PbZrTiO), may further include at least one of a rare earth metal or a transition metal, and may also include magnesium (Mg), a divalent metal. For example, the rare earth metal may include at least one of scandium (Sc), erbium (Er), yttrium (Y), or lanthanum (La), and the transition metal may include at least one of titanium (Ti), zirconium (Zr), hafnium (Hf), tantalum (Ta), or niobium (Nb).

In an example, a size of the SMR resonance unit 135S in a horizontal direction may be smaller than a size of the FBAR resonance unit 135F in the horizontal direction. Therefore, heat generated by the acoustic resonator filter 50i may be relatively more concentrated in the SMR resonance unit 135S, and the SMR resonance unit 135S having relatively good heat dissipation characteristics may efficiently dissipate the concentrated heat.

Referring to FIG. 2A, the SMR resonance unit 135S may further include at least one of SMR insertion layers 171S and 172S and SMR connection metal layers 181S and 182S, and the FBAR resonance unit 135F may further include at least one of FBAR insertion layers 171F and 172F and FBAR connection metal layers 181F and 182F.

In an example, the SMR insertion layers 171S and 172S and the FBAR insertion layers 171F and 172F may be formed of a dielectric material such as, but not limited to, silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$), zinc oxide (ZnO), or the like, but may be formed of a material, different from the SMR piezoelectric layer 150S and the FBAR piezoelectric layer 150F.

The SMR connection metal layers 181S and 182S and the FBAR connection metal layers 181F and 182F may electrically connect the SMR and the FBAR. In an example, the SMR connection metal layers 181S and 182S and the FBAR connection metal layers 181F and 182F may be implemented with a material having a relatively low specific resistance, such as with gold (Au), a gold-tin (Au—Sn) alloy, copper (Cu), a copper-tin (Cu—Sn) alloy, aluminum (Al), an aluminum alloy, or the like, but is not limited thereto.

Referring to FIG. 2E, an acoustic resonator filter 50j, in accordance with one or more embodiments, may include a sacrificial layer 130b surrounding a cavity 112F. The sacrificial layer 130b may support an SMR support unit 123S, and the SMR support unit 123S may support an SMR resonance unit 135S.

Figure 3A:
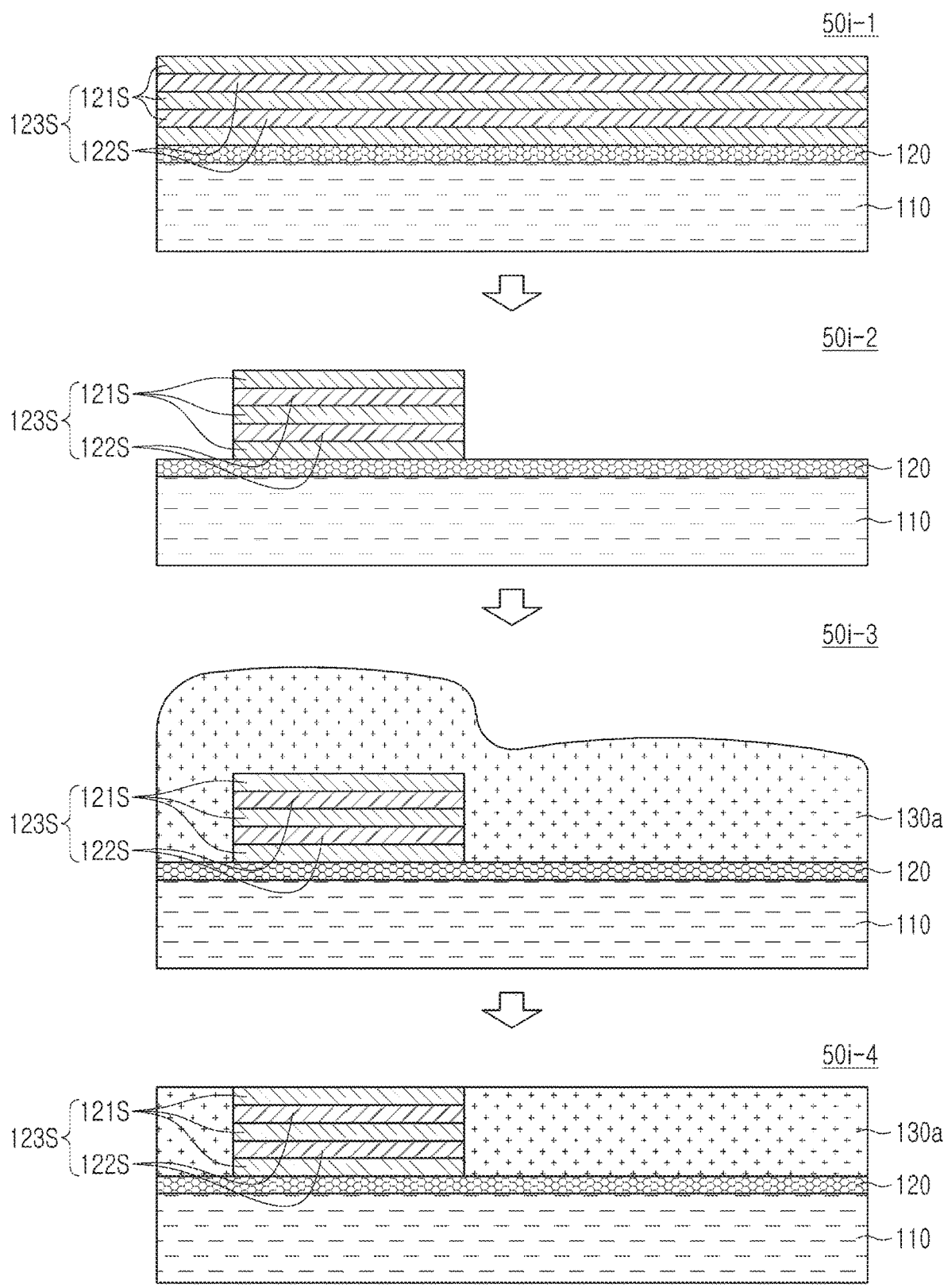
FIGS. 3A and 3B are views illustrating a process of manufacturing the example acoustic resonator filter illustrated in FIG. 2A.
Figure 3B:
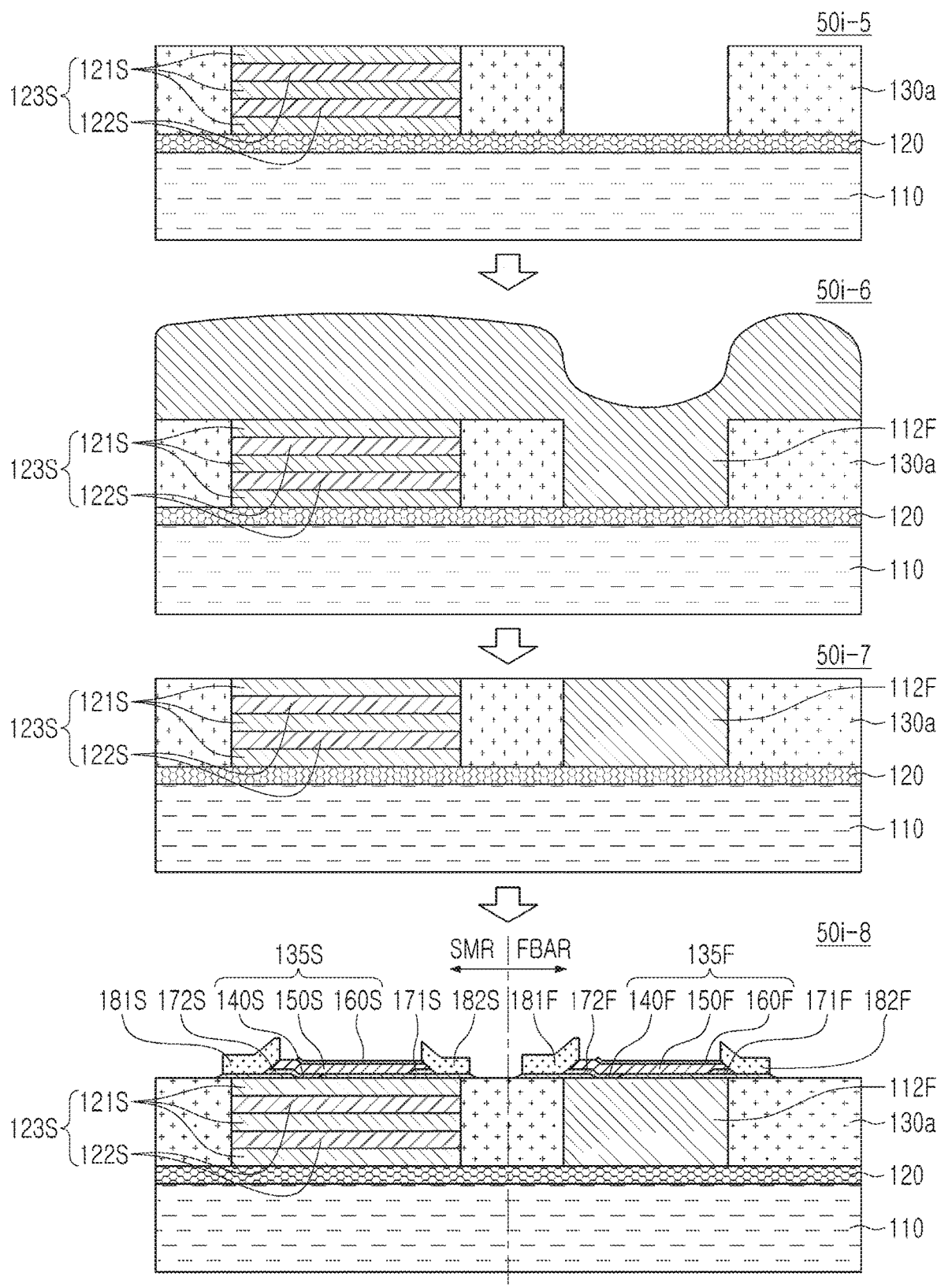

FIGS. 3A and 3B are views illustrating a process of manufacturing the acoustic resonator filter illustrated in FIG. 2A.

Referring to FIG. 3A, an acoustic resonator filter in a first operation 50i-1 may have a structure in which a substrate 110, an insulating layer 120, and an SMR support unit 123S are stacked.

In an example, the insulating layer 120 may be formed on the substrate 110 by using one of silicon dioxide ($SiO_2$) and aluminum oxide ($Al_2O_3$) by chemical vapor deposition, RF magnetron sputtering, or evaporation, as examples only.

An acoustic resonator filter in a second operation 50i-2 may have a structure in which a portion of the SMR support unit 123S is removed.

An acoustic resonator filter in a third operation 50i-3 may have a structure in which a sacrificial layer 130a is further disposed above the insulating layer 120. For example, the sacrificial layer 130a may be formed by chemical vapor deposition of polysilicon.

An acoustic resonator filter in a fourth operation 50i-4 may have a structure in which a portion of the sacrificial layer 130a is removed.

Referring to FIG. 3B, an acoustic resonator filter in a fifth operation 50i-5 may have a structure in which a portion of the sacrificial layer 130a is further removed. In an example, an etch stop layer may be additionally formed on a lateral surface of the sacrificial layer 130a. The etch stop layer may serve to protect the substrate 110 and the insulating layer 120 from an etching process, and may serve as a base for depositing other layers on the etch stop layer.

An acoustic resonator filter in a sixth operation 50i-6 may have a structure in which silicon dioxide ($SiO_2$) that may be filled in a cavity 112F is formed by chemical vapor deposition.

An acoustic resonator filter in a seventh operation 50i-7 may have a structure in which a portion of silicon dioxide ($SiO_2$) that may be filled in the cavity 112F is removed.

In an example, the sixth operation 50i-6 and the seventh operation 50i-7 may be omitted, and the cavity 112F may be formed of air.

An acoustic resonator filter in an eighth operation 50i-8 may have a structure in which an SMR resonance unit 135S and an FBAR resonance unit 135F are formed.

Figure 4A:
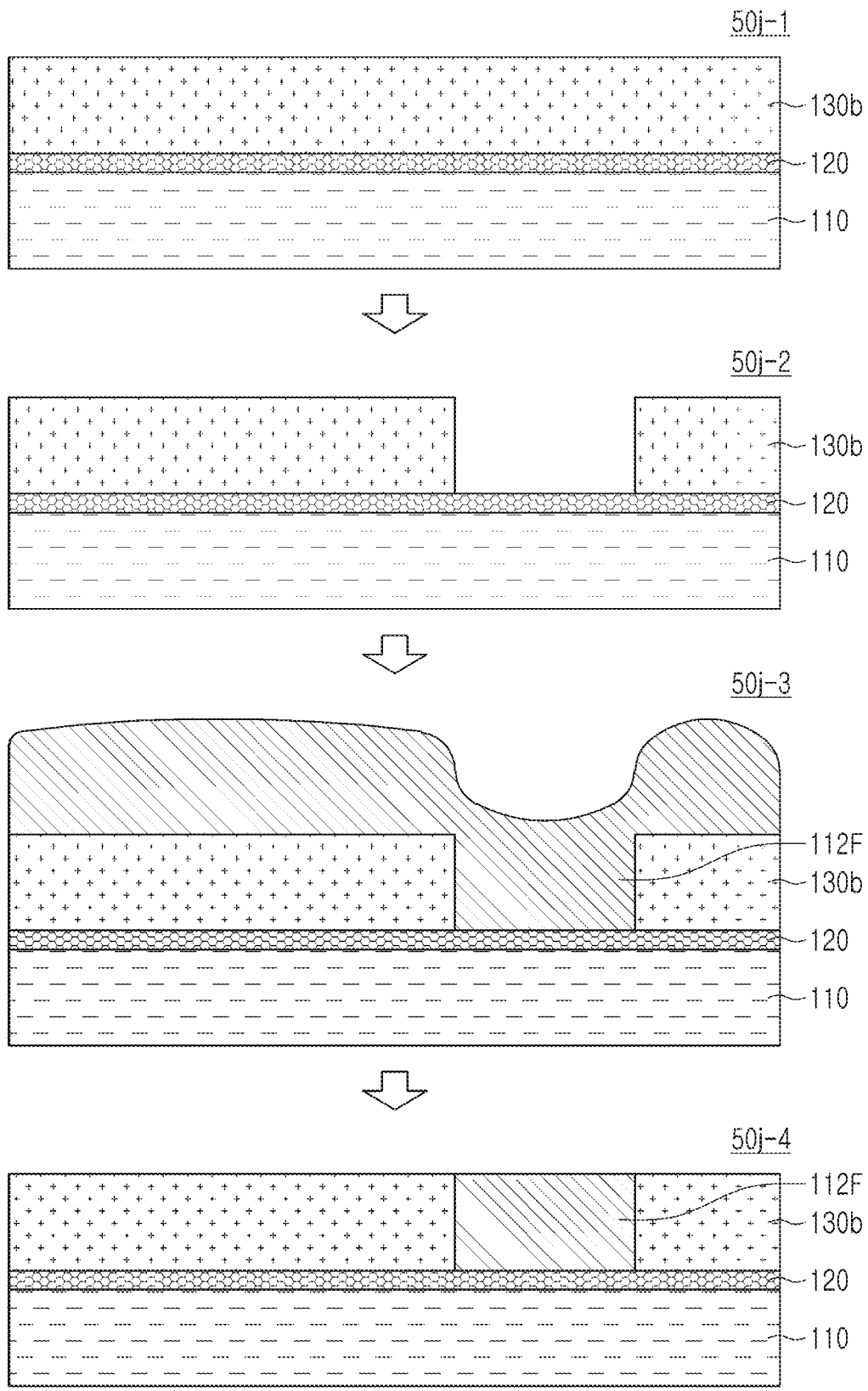
FIGS. 4A and 4B are views illustrating a process of manufacturing the example acoustic resonator filter illustrated in FIG. 2B.
Figure 4B:
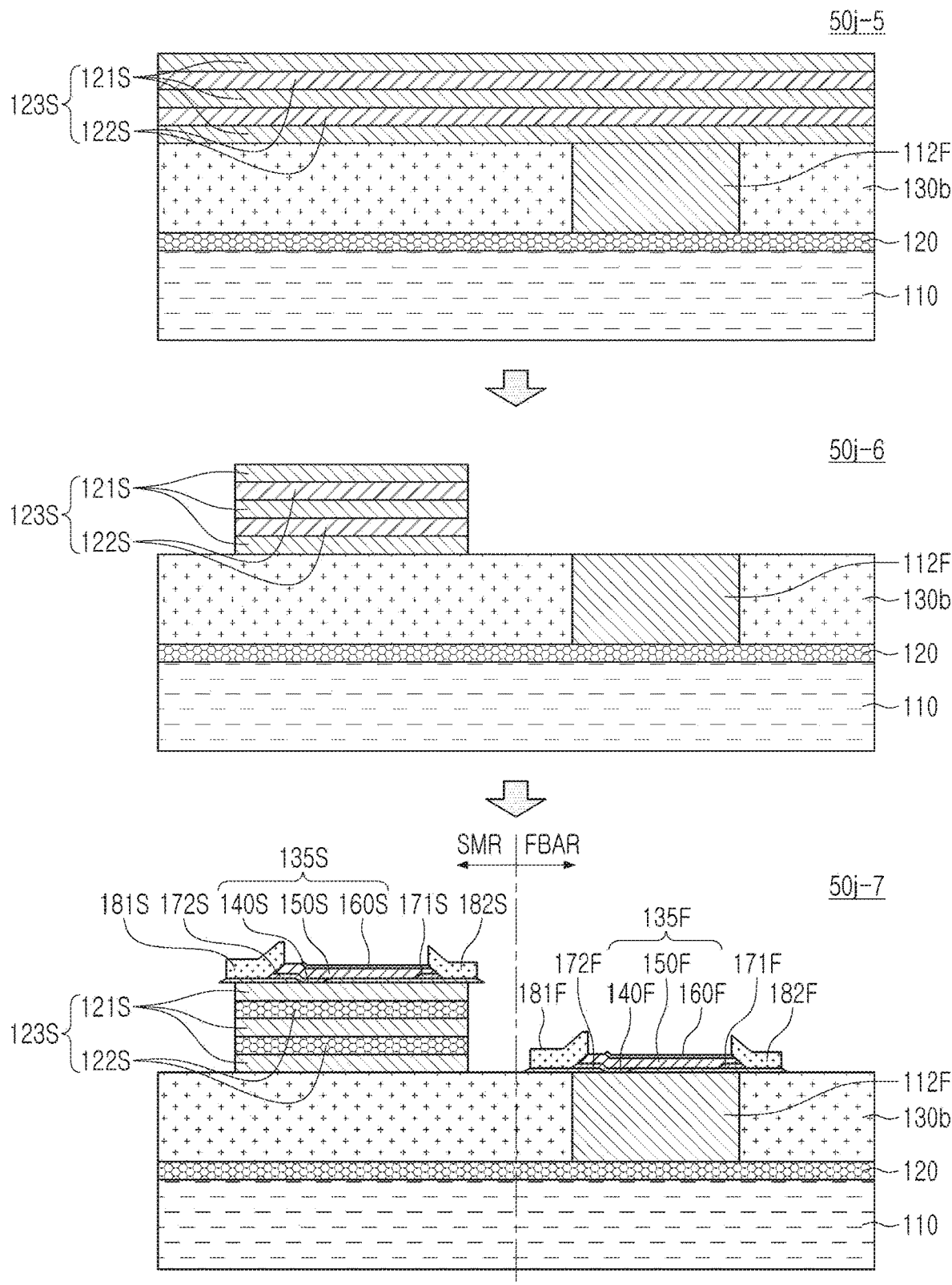

FIGS. 4A and 4B are views illustrating a process of manufacturing the acoustic resonator filter illustrated in FIG. 2B.

Referring to FIG. 4A, an acoustic resonator filter in a first operation 50j-1 may have a structure in which a substrate 110, an insulating layer 120, and a sacrificial layer 130b are alternately stacked.

An acoustic resonator filter in a second operation 50j-2 may have a structure in which a portion of the sacrificial layer 130b is removed.

An acoustic resonator filter in a third operation 50j-3 may have a structure in which silicon dioxide ($SiO_2$) that may be filled in a cavity 112F is formed by chemical vapor deposition.

Depending on a design, the second operation 50j-2 and the third operation 50j-3 may be omitted, and the cavity 112F may be formed of air.

An acoustic resonator filter in a fourth operation 50j-4 may have a structure in which a portion of silicon dioxide ($SiO_2$) that may be filled in the cavity 112F is removed.

An acoustic resonator filter in a fifth operation 50j-5 may have a structure in which an SMR support unit 123S is stacked on the sacrificial layer 130b.

An acoustic resonator filter in a sixth operation 50j-6 may have a structure in which a portion of the SMR support unit 123S is removed.

An acoustic resonator filter in a seventh operation 50j-7 has a structure including an SMR resonance unit 135S disposed on the SMR support unit 123S and an FBAR resonance unit 135F disposed on the cavity 112F.

Figure 5:
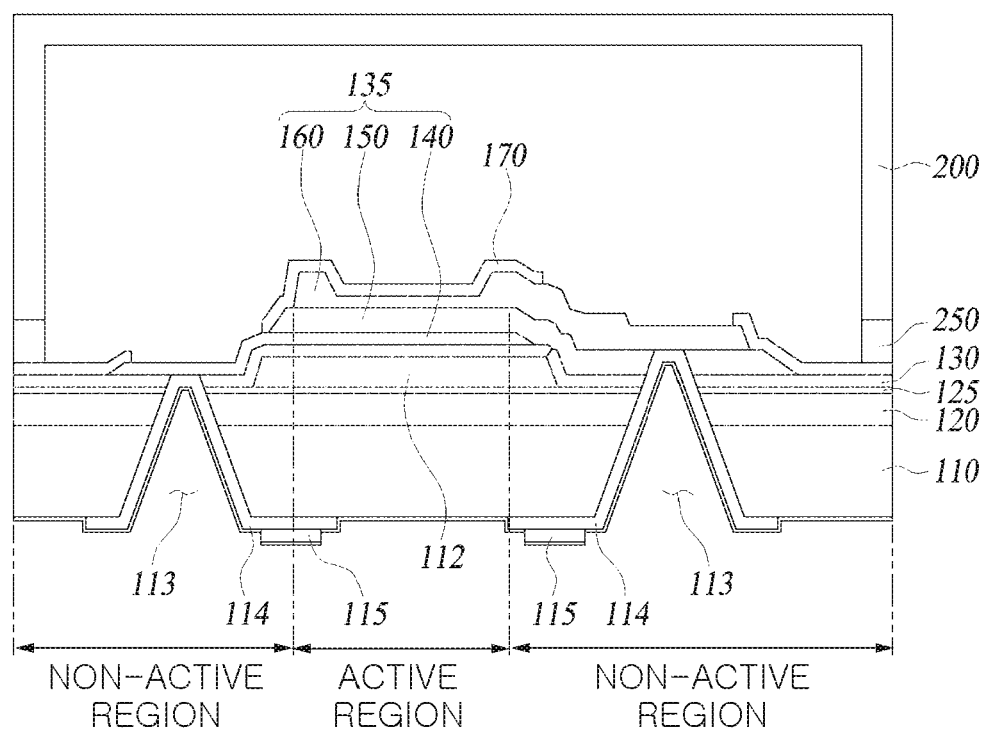
FIG. 5 is a view illustrating a peripheral structure of an example acoustic resonator filter, in accordance with one or more embodiments.

FIG. 5 is a view illustrating a peripheral structure of an acoustic resonator filter, in accordance with one or more embodiments.

Referring to FIG. 5, an acoustic resonator 10 may include a stack structure including a substrate 110, an insulating layer 120, a cavity 112, and a resonance unit 135, and a cap 200 coupled to the stack structure.

The resonance unit 135 may be divided into an active region and a non-active region. The active region of the resonance unit 135 may be a region that vibrates and resonates in a predetermined direction based on a piezoelectric phenomenon occurring in a piezoelectric layer 150 when electric energy such as a radio frequency signal is applied to a first electrode 140 and a second electrode 160, and may correspond to a region in which the first electrode 140, the piezoelectric layer 150, and the second electrode 160 overlap each other on the cavity 112 in a vertical direction. The non-active region of the resonance unit 135 may be a region that does not resonate based on a piezoelectric phenomenon even when electric energy is applied to the first electrode 140 and the second electrode 160, and may correspond to a region outside the active region.

A protective layer 170 may be disposed on the second electrode 160 of the resonance unit 135, to prevent the second electrode 160 from being externally exposed. The protective layer 170 may be formed of one of, as non-limiting examples, a silicon oxide-based insulating material, a silicon nitride-based insulating material, or an aluminum nitride-based insulating material. Although a single stack structure is accommodated in a single cap 200, as illustrated in FIG. 5, a plurality of stack structures may be accommodated in a single cap 200, and each of the plurality of stack structures may be interconnected, depending on an example. In this example, wiring electrodes may be provided on the first electrode 140 and the second electrode 160 externally exposed, to interconnect the plurality of stack structures.

The cap 200 may be joined to the stack structure, to protect the resonance unit 135 from an external environment. The cap 200 may be formed to have a cover shape having an internal space in which the resonance unit 135 is accommodated. Specifically, the cap 200 may have an accommodating portion formed in a central portion to accommodate the resonant portion 135, and may be coupled to the stack structure in an edge portion. The cap 200 may be joined to the protective layer 170 stacked on the substrate 110, as illustrated in FIG. 5, but this is only an example. The cap 200 may pass through the protective layer 170, to be joined to at least one of a membrane 130, the etch stop layer 125, the insulating layer 120, or the substrate 110.

The cap 200 may be joined to the substrate 110 by eutectic bonding. In this example, after depositing an adhesive 250 capable of eutectic bonding with the substrate 110 on the stack structure, a substrate wafer and a cap wafer may be pressed and heated, to join them. The adhesive 250 may include a eutectic material of copper (Cu)-tin (Sn), and, in addition, may also include solder balls.

At least one via hole 113 passing through the substrate 110 in a thickness direction may be formed on a lower surface of the substrate 110. In addition to the substrate 110, the via hole 113 may pass through a portion of the insulating layer 120, the etch stop layer 125, and the membrane 130 in the thickness direction. A connection pattern 114 may be formed inside the via hole 113, and the connection pattern 114 may be formed on an inner surface of the via hole 113, e.g., an entire inner wall of the via hole 113. In an example, the via hole 113 may be omitted, and a structure of the connection pattern 114 may be replaced with a structure of a wire bonding.

The connection pattern 114 may be prepared by forming a conductive layer on the inner surface of the via hole 113. For example, the connection pattern 114 may be formed by depositing, coating, or filling a conductive metal such as gold or copper along the inner wall of the via hole 113. For example, the connection pattern 114 may be made of a titanium (Ti)-copper (Cu) alloy.

The connection pattern 114 may be connected to at least one of the first electrode 140 or the second electrode 160. In an example, the connection pattern 114 may pass through at least a portion of the substrate 110, the membrane 130, the first electrode 140, and the piezoelectric layer 150, to be electrically connected to at least one of the first electrode 140 or the second electrode 160. The connection pattern 114 formed on the inner surface of the via hole 113 may extend toward the lower surface of the substrate 110, and may be connected to the connection pad 115 for a substrate to be provided on the lower surface of the substrate 110. Therefore, the connection pattern 114 may electrically connect the first electrode 140 and the second electrode 160 to the connection pad 115 for a substrate.

The substrate connection pad 115 may be electrically connected to an external substrate that may be disposed below the acoustic resonator 10, by bumps. The acoustic resonator 10 may perform a filtration operation of a radio frequency signal, by a signal applied to the first and second electrodes 140 and 160 through the connection pad 115 for a substrate.

An acoustic resonator filter, in accordance with one or more embodiments, may obtain excellent heat dissipation characteristics, while securing excellent filtration characteristics (e.g., insertion loss, pass band ripple, return loss, and attenuation), and a relatively high implementation effect.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator filter, comprising:
    a rear filter, electrically connected between a front port and a rear port, through which a radio frequency (RF) signal passes, the rear filter comprising at least one film bulk acoustic resonator (FBAR);
    a front filter, electrically connected between the front port and the rear filter, and comprising at least one solidly mounted resonator (SMR);
    an insulating layer disposed below the rear filter and the front filter; and
    a substrate disposed below the insulating layer.

2. The acoustic resonator filter of claim 1,
    wherein each of the at least one SMR comprises:
    an SMR resonance unit; and
    an SMR support unit disposed between the SMR resonance unit and the insulating layer, and in which at least one SMR metal layer and at least one SMR insulating layer are alternately stacked.

3. The acoustic resonator filter of claim 2, wherein each of the at least one FBAR comprises:
    an FBAR resonance unit; and
    a cavity located between the FBAR resonance unit and the insulating layer.

4. The acoustic resonator filter of claim 3, further comprising a sacrificial layer surrounding the cavity,
    wherein the SMR support unit is disposed between the SMR resonance unit and the sacrificial layer.

5. The acoustic resonator filter of claim 3, further comprising a sacrificial layer that respectively surrounds at least a portion of the SMR support unit and the cavity.

6. The acoustic resonator filter of claim 2, wherein the SMR support unit is disposed to not overlap the FBAR in a vertical direction.

7. The acoustic resonator filter of claim 2, wherein each of the at least one FBAR comprises an FBAR resonance unit, and
    wherein a size of the SMR resonance unit in a horizontal direction is smaller than a size of the FBAR resonance unit in the horizontal direction.

8. The acoustic resonator filter of claim 1, wherein the at least one SMR comprises:
    at least one series SMR, electrically connected in series between the front port and the rear port; and
    at least one shunt SMR, shunt-connected to the at least one series SMR, and
    wherein the at least one FBAR comprises:
    at least one series FBAR, electrically connected in series between the front port and the rear port; and
    at least one shunt FBAR shunt-connected to the at least one series FBAR.

9. The acoustic resonator filter of claim 8, wherein a number of the at least one SMR is less than a number of the at least one FBAR.

10. The acoustic resonator filter of claim 8, wherein the at least one series SMR has a structure in which a plurality of series SMRs are connected in parallel with each other.

11. The acoustic resonator filter of claim 1, wherein the front filter further comprises at least one second FBAR.

12. The acoustic resonator filter of claim 11, wherein the front filter comprises at least one hybrid unit respectively having a structure in which the at least one second FBAR and the at least one SMR are connected in parallel with each other.

13. The acoustic resonator filter of claim 11, wherein a size per one of the at least one SMR is smaller than a size per one of the at least one second FBAR.

14. The acoustic resonator filter of claim 1, wherein the rear filter has a pass band, and the front filter has a pass band.

15. An acoustic resonator filter, comprising:
    a rear filter, electrically connected between a front port and a rear port, through which a radio frequency (RF) signal passes, the rear filter comprising at least one first film bulk acoustic resonator (FBAR); and
    a front filter, electrically connected between the front port and the rear filter, and comprising at least one solidly mounted resonator (SMR) and at least one second FBAR,
    wherein the front filter comprises at least one hybrid unit respectively having a structure in which the at least one second FBAR and the at least one SMR are connected in parallel with each other.

16. The acoustic resonator filter of claim 15, wherein the at least one hybrid unit comprises:
    at least one series hybrid unit electrically connected in series between the front port and the rear port; and
    at least one shunt hybrid unit shunt-connected in the series hybrid unit.

17. The acoustic resonator filter of claim 16, wherein the at least one series hybrid unit comprises a plurality of series hybrid units connected in series with each other, wherein a size of the SMR resonance unit of the series hybrid unit connected adjacent to the rear port in a horizontal direction, among the plurality of series hybrid units, is smaller than a size of the SMR resonance unit of the series hybrid unit connected adjacent to the front port in the horizontal direction, among the plurality of series hybrid units.

18. An acoustic resonator filter, comprising:

a rear filter, electrically connected between a front port and a rear port, through which a radio frequency (RF) signal passes, the rear filter comprising at least one first film bulk acoustic resonator (FBAR); and a front filter, electrically connected between the front port and the rear filter, and comprising at least one solidly mounted resonator (SMR) and at least one second FBAR, wherein a size per one of the at least one SMR is smaller than a size per one of the at least one second FBAR.

* * * * *